(12) United States Patent
Ashdown

(10) Patent No.: US 6,812,562 B2
(45) Date of Patent: Nov. 2, 2004

(54) METHOD AND APPARATUS FOR SURFACE MOUNTED POWER TRANSISTOR WITH HEAT SINK

(75) Inventor: Glynn Russell Ashdown, Lake Bluff, IL (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/747,599

(22) Filed: Dec. 22, 2000

(65) Prior Publication Data

US 2001/0050429 A1 Dec. 13, 2001

Related U.S. Application Data

(60) Provisional application No. 60/173,873, filed on Dec. 30, 1999.

(51) Int. Cl.[7] .......................... H01L 23/34; H01L 23/10
(52) U.S. Cl. ...................... 257/713; 257/257; 257/712; 257/730; 257/706
(58) Field of Search ................................ 257/703, 704, 257/706, 712, 713, 717, 718–720, 722, 726, 727, 730, 731, 675, 732, 733, 693, 700

(56) References Cited

U.S. PATENT DOCUMENTS

| | | | | |
|---|---|---|---|---|
| 5,329,426 A | * | 7/1994 | Villani |
| 5,659,199 A | * | 8/1997 | Mori et al. |
| 5,825,622 A | * | 10/1998 | Rife et al. |
| 5,912,592 A | * | 6/1999 | Kikushima |
| 5,945,736 A | * | 8/1999 | Rife et al. |
| 6,352,435 B1 | * | 3/2002 | Perino et al. |

* cited by examiner

Primary Examiner—Long Pham
Assistant Examiner—DiLinh Nguyen
(74) Attorney, Agent, or Firm—W. Daniel Swayze, Jr.; W. James Brady; Frederick J. Telecky, Jr.

(57) ABSTRACT

A surface mounted power transistor is provided with a heat sink by positioning a mounting plate of a heat sink between the power transistor and a solder pad on the circuit board. The mounting plate of the heat sink is provided with a plurality of openings through which the solder of the solder pad flows during the solder reflow process so that the mounting plate is securely adhered between the power transistor and the circuit board. The mounting plate of the heat sink is connected thermally to an extension member which extends generally perpendicular to the mounting plate, the extension member in turn being connected to a heat dissipation surface which may be one or several fins.

15 Claims, 1 Drawing Sheet

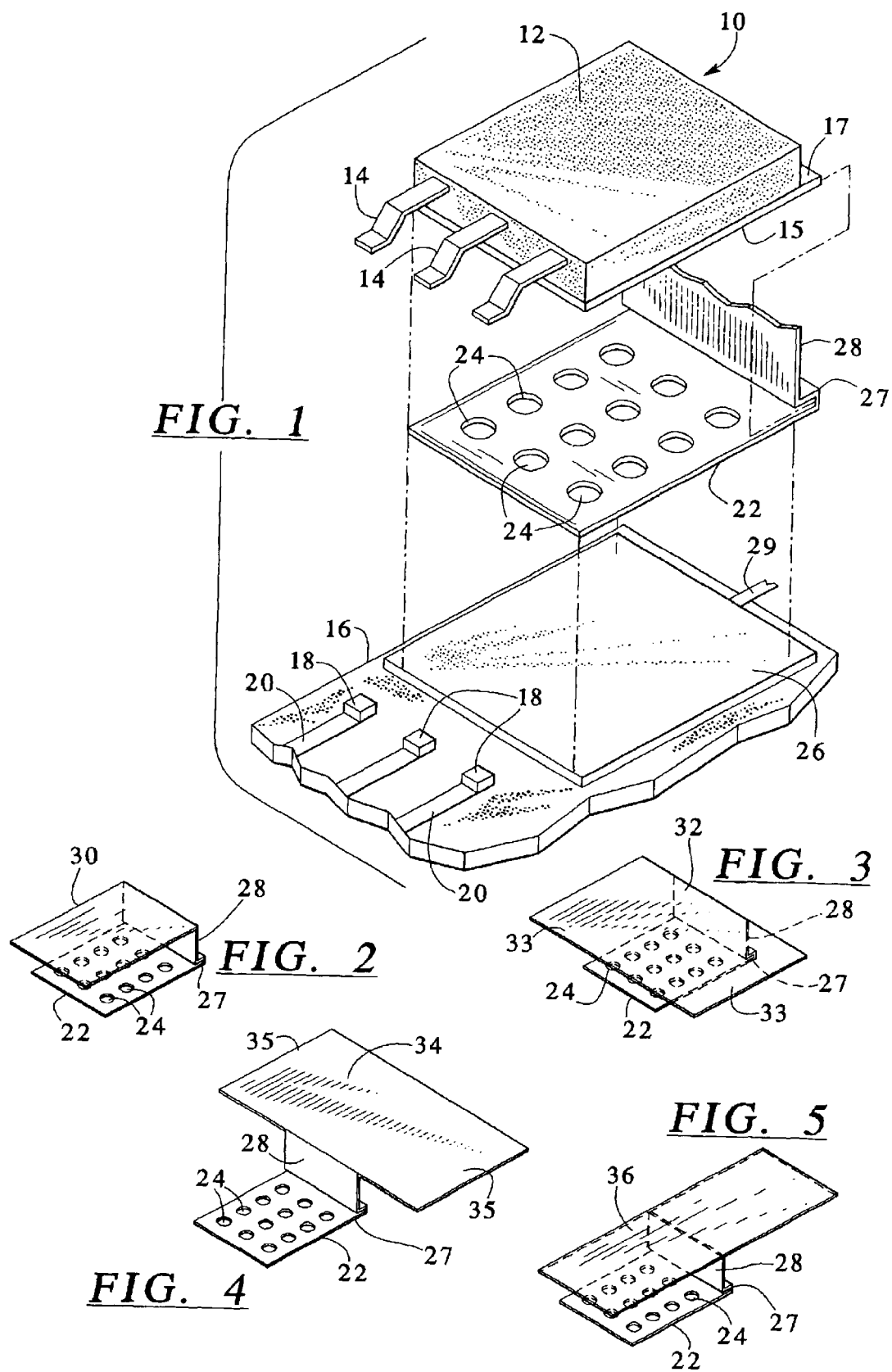

METHOD AND APPARATUS FOR SURFACE MOUNTED POWER TRANSISTOR WITH HEAT SINK

CROSS-REFERENCED TO RELATED CO-PENDING APPLICATION

This application claims the benefit of U.S. Provisional Application No. 60/173,873, filed Dec. 30, 1999.

BACKGROUND OF THE INVENTION

1. Field of the Invention

The present invention relates generally to a method and apparatus for mounting a heat sink on a heat producing electrical circuit component.

2. Description of the Related Art

Heat producing components such as field effect transistors often require heat sinks to carry away the thermal energy produced by the component. To increase the heat dissipation of the heat sink by positioning the heat sink in an air flow, typical mounting arrangements for these heat producing components include providing a finned heat sink that is elevated off a mounting surface or circuit board to which the combined heat sink/component is mounted, and the heat producing component itself is typically mounted on the elevated surface of the heat sink instead of directly on the mounting surface. For field effect power transistors, the transistor may instead be mounted in a vertical orientation on a circuit board with the heat sink mounted to one side of the transistor, thereby positioning the heat sink in an air flow. In another arrangement, the field effect transistor is mounted horizontally on the circuit board or mounting surface and a heat sink is mounted on the opposite surface of the field effect transistor to position the heat sink in the air flow or the heat sink is mounted on an opposite surface of the circuit board from the field effect transistor.

Each of these methods for mounting a heat sink to a heat producing component requires a separate mounting step for the mounting of the heat sink from the step mounting the component, each requires a separate affixing location for the heat sink and the component, and each results in a relatively high profile structure.

SUMMARY OF THE INVENTION

An objective of the present invention is to provide a heat sink for a surface mountable heat producing component which affixes the surface mountable component to the circuit board and the heat sink to the surface mountable component in a single step. Another objective is to provide a low profile heat sink. A further objective is to provide a heat sink having a small foot print occupying a minimum area on a mounting surface. Yet a further objective is the invention is to minimize space interference between the heat sink and other components to be mounted on the mounting surface. Still another objective of the invention is to provide a surface mountable heat sink.

The invention provides the advantage of eliminating the need for a separate mounting step of a heat sink while permitting low profile surface mounting of the heat producing component, all without requiring mounting holes through the circuit board. The present invention also provides a low profile heat sink, enabling more compact circuits to be produced with tighter clearances between adjacent circuit boards, for example. The present invention also eliminates the need for multiple affixing locations by requiring application of solder only to a single surface for mounting of the component to a circuit board and for mounting of the heat sink.

These and other objectives and advantages of the invention are provided by a heat sink having a mounting plate which extends between a mounting surface of the heat producing component and the circuit board on which the component is to be mounted. The mounting plate of the heat sink is provided with solder conducting openings which pass through the plate. A solder pad is formed on the circuit board or on the heat producing component and the mounting pad is positioned against the solder pad so that during a solder reflow process, the liquid solder flows through the solder conducting openings to solder the mounting plate of the heat sink to the circuit board and to solder the heat producing component to the mounting plate of the heat sink.

The mounting plate of the heat sink is thermally connected to a heat dissipating element. The heat dissipating element may be a traditional finned heat sink structure. However, various preferred embodiments of the invention provide heat dissipating elements which present a low profile. In particular, the heat dissipating element in each of the preferred embodiments extends substantially parallel to the circuit board on which the component is mounted, and so provide a low profile for the component and heat sink combination from the surface of the circuit board. Miniaturization of the circuit is thereby facilitated.

For purposes of the present invention, the term heat producing component relates to any component to be cooled, and references to circuit boards or mounting locations refer to any location or surface at which the component is to be mounted.

BRIEF DESCRIPTION OF THE DRAWINGS

FIG. 1 is an exploded perspective view of a power transistor for surface mounting on a circuit board between which is provided the mounting plate of the present heat sink;

FIG. 2 is a perspective view of a first embodiment of the present heat sink according to the principles of the present invention;

FIG. 3 is a perspective view of a second embodiment of the present heat sink;

FIG. 4 is a perspective view of a third embodiment of the heat sink of the invention; and FIG. 5 is a perspective view of a fourth embodiment.

DETAILED DESCRIPTION OF THE PREFERRED EMBODIMENTS

In FIG. 1, a power transistor 10 has a housing 12 and three surface mount leads 14 extending from the housing 12. The power transistor 10 is a field effect transistor (FET), although for purposes of the present invention it may be any heat producing component or component to be cooled. The power transistor 10 is to be mounted on a circuit board 16. In the illustration, the power transistor 10 is to be surface mounted onto the circuit board 16 by soldering of the transistor leads 14 onto solder pads 18 on the circuit board. The solder pads 18 are connected by surface leads or lands 20 to other components (not shown) on the circuit board 16 which together with the power transistor form an electrical circuit. The power transistor 10 is to be surface mounted, so that it is mounted flat, lying substantially parallel to the circuit board 16. Not only does this facilitate the surface mounting of the transistor leads 14, but it also provides a lower clearance for the component above the circuit board 16 to facilitate miniaturization of the electronic device in which the component is used. The power transistor 10 has a metal plate 15 on its mounting surface, and the metal plate 15 has a tab 17 extending from the housing along one edge thereof. In the illustration, the tab 17 extends from the edge opposite the leads 14, although it may extend from another edge.

According to the present invention, a mounting plate 22 is positioned between the circuit board 16 and the power transistor 10. In the illustrated embodiment, the mounting plate 22 has the same profile shape as the mounting surface of the power transistor housing 12. Specifically, the mounting plate 22 has the same shape at the metal plate 15. The mounting plate 22 has a plurality of openings 24 that, in the illustrated example, are in a regular arrangement in the mounting plate.

A vertical portion or extension 28 extends perpendicularly from the mounting plate 22. The extension 28 has a channel 27 that is formed to accept the tab 17. The tab 17 of the power transistor 10 is inserted into the channel 27 and the channel 27 is crimped closed to hold the transistor 10 in position until completion of the mounting process. This crimping of the channel 27 on the tab 17 is referred to as a pre-mounting of the power transistor to the mounting plate 22.

The extension 28 extends to a heat dissipation element (see FIG. 2, for example) which may be any configuration capable of dissipating the heat generated by the power transistor 10 during its operation. For example, the heat dissipation element may be a traditional finned structure. Other shapes are possible as well. The mounting plate 22 and the extension 28 along with the heat dissipation element are of a thermally conductive material, such as copper. It is preferred that the mounting pad and heat dissipation element be shaped so that they may be formed by extrusion.

On the surface of the circuit board 16 is a solder pad 26 for soldering the mounting pad 22 and power transistor 10 to the circuit board 16. Although the solder pad 26 may be generally of the same surface area and dimensions of the mounting plate 22, it is preferably slightly larger in area than the mounting pad 22 so as to increase the quantity of solder in the to solder pad 26. The solder pad 26 may instead or in addition be thicker than is required to solder only the power transistor 10 in place.

A ground connection for the power transistor 10 is provided by a ground lead 29 that is on the surface of the circuit board 16 and which extends under the solder pad 26.

During assembly, the circuit board 16 is prepared by forming the circuit leads 20 and the ground lead 29 at their respective locations for connection into the electrical circuit. The solder pads 18 and the large solder pad 26 is also formed on the circuit board 16. Solder is printed onto the circuit board 16 according to the known solder application techniques. For example, a mask having openings for the solder pads 18 and 26 is positioned over the circuit board 16. A squeegee or a doctor blade is used to spread the solder material evenly and with a uniformly flat surface. The mask has an opening larger than the mounting plate 22 to form the solder pad 26 in a slightly larger area than the mounting plate 22. Alternately, by shaping the mask to be thicker in the region of the solder pad 26, a thicker application of solder at the solder pad 26 is accomplished as a way to increase the quantity of solder in the solder pad 26.

After the circuit board structures have been formed, the mounting plate 22 with the power transistor 10 crimped in the channel 27 to retain the two in position is placed atop the solder pad 26. The transistor leads 14 are aligned with and positioned atop the circuit solder pads 16. Following the positioning step, a solder reflow process is undertaken by heating the components and the circuit board, such as in an oven. The solder pad 26 liquifies and some of the solder from the pad flows through the openings 24 to the mounting surface at the metal plate 15 at the underside of the power transistor 10 and some of the solder remains between the circuit board 16 and the mounting plate 22, so that when cooled the solder affixes the power transistor 10 to the mounting plate 22 which is in turn affixed to the circuit board 16 by the solder. Since some of the solder of the solder pad is sucked up through the openings 24, the solder pad whish is slightly larger than the mounting plate provides the extra quantity of solder needed.

The transistor leads 14 are also soldered to the circuit solder pads 18 during this solder reflow process. Any other solder connections for other components on the circuit board are formed simultaneously during this reflow step. Thus, the mounting of the power transistor 10 to the circuit board 16 for electrical operation simultaneously mounts the mounting plate 22 of the heat dissipation sink in place.

In the preferred embodiment, the mounting plate 22 and its associated heat dissipation element are of copper and the solder conducting openings 24 are generally of 0.040 inches in diameter. This size opening has been found to readily conduct the liquified solder through the mounting plate 22 to the transistor surface during the reflow process. Other sizes of solder conducting openings 24 are contemplated as needed for solder or adhesive materials of different viscosities. An adhesive, such as a thermally activated adhesive material may be provided in place of the solder pad 26. The solder conducting openings 24 are arranged in a grid arrangement. The openings may be in some other arrangement, including staggered rows, for example. The openings 24 are circular bores but may be slots, channels, or other shapes as desired.

Only a single reflow operation need be performed to mount and bond all components together in a single step. The resulting assembly is of a low profile and a small size, and assembly is rapid since separate fastening steps are eliminated. The size of the mounting plate 22 and the solder pad 26 there underneath can be configured to conform to any transistor or other heat generating component requiring cooling.

In FIG. 2 is shown an illustration of a heat conducting element 30 which extends from the vertical extension 28 to a position generally parallel to and overlying the mounting plate 22. The heat dissipation element 30 is spaced from and lying over the power transistor 10 when in place so that the resulting heat sink assembly occupies no greater surface area of the circuit board than the power transistor itself and only slightly more height from the circuit board 16 than the transistor alone. The heat dissipating element 30 is a plate formed by bending a sheet of thermally conductive material at two parallel lines into a generally "U" shape, one leg of the "U" being the mounting plate 22 with openings 24. The heat dissipating element 30 is approximately the same size as the mounting plate 22 as seen in FIG. 2, although other sizes of the heat conducting element 30 are also contemplated. To obtain sufficient heat dissipation surface for most applications, the heat dissipating element is at least as large as the transistor 10.

An alternative embodiment of the heat sink is shown in FIG. 3 wherein a heat dissipation element 32 is provided over and generally parallel to the mounting pad 22 but extending to a greater length in a transverse direction than the embodiment of FIG. 2. The heat sink of FIG. 3 provides a greater thermal dissipation surface than the embodiment of FIG. 2. However, the element 32 has lateral extensions 33 that may interfere with some circuit arrangements.

Should the circuit components on the circuit board 16 require a heat dissipation element arranged differently then shown in FIG. 3, an alternative arrangement of the heat dissipation element 34 is shown in FIG. 4 wherein the heat dissipation element 34 is bent in a direction opposite that shown in FIG. 3 so that from a side view the device has a Z-shape. The element 34 has lateral extensions 35 at each end. The heat dissipation element 34 and extensions 35 extend over a region of the circuit board 16 at a position adjacent one side of the transistor or other element 10. Some circuit board arrangements may better utilize the embodiment of FIG. 4 rather than FIG. 3, or visa versa. Both are formed from the same blank by bending in a different direction.

In the embodiments of FIGS. 3 and 4, the extended portions 33 and 35 of the heat dissipation elements 32 and 34 are in a traverse direction relative to the vertical extension 28 from the power transistor. Should the components on the circuit board onto which the device is mounted lack clearance for such transverse extensions, a sink heat as shown in FIG. 5 may be provided. In the embodiment of FIG. 5, an extended heat dissipation element 36 extends both over the mounting pad 22 and in an opposite direction relative to the vertical extension 28. The heat dissipation element 36 may be formed from a flat blank by bending portions back on themselves to achieve the shape of FIG. 5. The heat sink of FIG. 5 is formed alternatively by extrusion. It may also be formed by stamping and folding the sheet material back on itself.

The heat sink is shown in the present invention is of a simple construction which may be formed from a sheet of thermally conductive material such as copper. The embodiments of FIGS. 2, 3 and 4 are all formed by merely cutting, drilling and bending the sheet without assembly of any further parts. In FIG. 5, the heat dissipation surface 36 would require an assembly step or an extrusion to form this embodiment. It is contemplated that many other arrangements of heat dissipation elements such as multiple finned surface or the like may be provided to carry the heat from the heat generating component 10, through the mounting pad 22, through the vertical extension 28 and to the heat dissipating element 30–36. Heat is, of course, dissipated from the pad 22 and extension 28 as well as from the component 10 itself. Greater heat dissipation may be achieved by heat dissipating elements with a greater height from the circuit board. Use of these is acceptable if clearance is not an issue. However, for minimum height requirements, the illustrated embodiments provide heat dissipation with only slightly greater heights from the circuit board surface than the surface mount transistor alone.

The heat dissipating element of the illustrated embodiments may be used as an attachment surface for more conventional heat sink structures where space permits and where heat generation requires it. Such conventional heat sink structures include finned structures. As an alternative, the traditional heat sink structure may be formed integrally with the top portion of the present heat sink. The result is a traditional heat sink with the mounting plate according to FIG. 1.

Thus, there is shown and described a heat sink for a surface mounted component and method which provides for assembly of the heat sink with the component while mounting the component on the circuit board all in one step. The resulting assembly is compact to provide for a reduced size for the overall apparatus into which it is incorporated. The assembled circuit board, heat sink and component assembly is affixed together as strong or even more strongly than mounting of the component directly on the circuit board. All of these advantages are achieved using a single reflow process for the assembly.

Although other modifications and changes may be suggested by those skilled in the art, it is the intention of the inventors to embody within the patent warranted hereon all changes and modifications as reasonably and properly come within the scope of their contribution to the art.

I claim:

1. A heat sink assembly, comprising:
   a circuit board having a mounting pad provided with an adhesive material in a mounting region;
   a mounting plate formed of a thermally conductive material and defining a plurality of adhesive flow openings therethrough, said mounting plate having a first major surface being positioned on said mounting pad of said circuit board;
   a heat dissipation element thermally connected to said mounting plate and being spaced from said circuit board, said heat dissipating element being disposed in a position to receive air flow on both sides;
   a heat generating component mounted on said mounting plate at a second major surface opposite said first major surface, said heat dissipating element being spaced from said heat generating component to permit air flow between said heat dissipating element and said heat generating component;
   an extension generally perpendicular to said mounting plate in a direction opposite said first major surface and extending substantially along the entire length of said mounting plate; and
   a portion of said extension generally parallel to said mounting plate and spaced therefrom.

2. A heat sink assembly as claimed in claim 1, wherein said adhesive material is electrical solder.

3. A heat sink assembly as claimed in claim 1, wherein said adhesive material is thermal adhesive.

4. A heat sink assembly as claimed in claim 1, wherein said portion overlies said mounting plate.

5. A heat sink as claimed in claim 1, wherein said portion includes lateral extensions.

6. A heat sink as claimed in claim 1, wherein said mounting plate and said extension and said portion form a U shape.

7. A heat sink assembly as claimed in claim 1, wherein said circuit board is in a first plane, said heat dissipating element is in a second plane and said heat generating element is in a third plane, said first and second planes are spaced apart and said third plane having said heat generating element is disposed between said first and second plane.

8. A heat sink as claimed in claim 7, wherein said first and second and third planes are substantially parallel to one another.

9. A heat sink assembly, comprising:
   a circuit board having a mounting pad provided with an adhesive material in a mounting region;
   a mounting plate formed of a thermally conductive material and defining a plurality of adhesive flow openings therethrough, said mounting plate having a first major surface being positioned on said mounting pad of said circuit board;
   a heat dissipation element thermally connected to said mounting plate and being spaced from said circuit board, said heat dissipating element being disposed in a position to receive air flow on both sides;

a heat generating component mounted on said mounting plate at a second major surface opposite said first major surface, said heat dissipating element being spaced from said heat generating component to permit air flow between said heat dissipating element and said heat generating component; and an extension generally perpendicular to said mounting plate in a direction opposite said first major surface and extending substantially along the entire length of said mounting plate, wherein said mounting plate and said extension and a portion of said extension form a Z shape.

10. A heat sink assembly, comprising:

a circuit board having a mounting pad provided with an adhesive material in a mounting region, a mounting plate formed of a thermally conductive material and defining a plurality of adhesive flow openings therethrough, said mounting plate having a first major surface being positioned on said mounting pad of said circuit board;

a heat dissipation element thermally connected to said mounting plate and being spaced from said circuit board, said heat dissipating element being disposed in a position to receive air flow on both sides;

a heat generating component mounted on said mounting plate at a second major surface opposite said first major surface, and a channel along an edge of said mounting plate, said channel receiving a tab extending from said heat generating component.

11. A heat sink for a surface mounted heat generating component, comprising:

a mounting plate of a generally planer configuration defining a plurality of openings therethrough for adhesive flow through said openings;

an extension member extending generally perpendicular to said mounting plate and extending substantially along the entire length of said mounting plate;

a portion of said extension member generally parallel to said mounting plate and spaced therefrom; and a heat dissipation element connected to said extension member, said heat dissipation element and said extension member surface and said mounting plate being thermally conductive and said heat dissipating element being spaced from the heat generating component in a direction parallel to a major surface of said heat generating component.

12. A surface mountable heat sink for a component, comprising:

a substantially planar mounting plate having an outer extent substantially a same shape and dimensions as a footprint of the component, said mounting plate defining openings extending therethrough;

a vertical portion extending at a substantially right angle from said mounting plate, said vertical portion having a first end at said mounting plate and a second end opposite said first end; and a heat dissipating fin connected to said second end of said vertical portion, said heat dissipating fin having an extent in a direction substantially parallel to said mounting plate and spaced therefrom and extending substantially along the entire length of said mounting plate, said heat dissipating fin being spaced from the component in a direction perpendicular to said mounting plate when the component is mounted on said mounting plate so as to define an air gap between said heat dissipating fin and the component.

13. A surface mountable heat sink and component, comprising:

a substantially planar mounting plate having an outer extent substantially a same shape and dimensions as a footprint of the component, said mounting plate defining opening extending therethrough;

a vertical portion extending at a substantially right angle from said mounting plate, said vertical portion having first end at said mounting plate and a second end opposite said first and; and a heat dissipating fin connected to said second end of said vertical portion, said heat dissipating fin having a extent in a direction substantially parallel to said mounting plate and space therefrom, said heat dissipating fin being spaced from the component when the component is mounted on said mounting plate, and a channel between said mounting plate and said vertical portion, said channel receiving a portion of the component when the component is mounted on said mounting plate.

14. A power transistor mounting, comprising:

a power transistor component having a housing and leads and a back plate, said back plate having an edge portion extending beyond said housing;

a perforate plate disposed against said back plate of said power transistor;

a channel connected to said perforate plate, said channel engaging said edge portion of said back plate;

a vertical portion extending from said channel in a direction substantially perpendicular to said perforate plate, said vertical portion having a first end at said channel and a second end opposite said first end; and a heat dissipating fin connected to said second end of said vertical portion, said heat dissipating fin including a planar part substantially parallel to said perforate plate and spaced from said power transistor to receive an air flow;

said perforate plate and said channel and said vertical portion and said heat dissipating fin being formed of a heat conducing material to dissipate heat generated by the power transistor.

15. A heat sink assembly, comprising:

a circuit board having a mounting pad provided with an adhesive material in a mounting region;

a mounting plate formed of a thermally conductive material and defining a plurality of adhesive flow openings therethrough, said mounting plate having a first major surface being positioned on said mounting pad of said circuit board;

an extension generally perpendicular to said mounting plate in a direction opposite said first major surface and extending substantially along the entire length of said mounting plate;

a portion of said extension generally parallel to said mounting plate and spaced therefrom;

a heat dissipation element thermally connected to said mounting plate and being spaced from said circuit board, said heat dissipating element being disposed with an air gap below between said heat dissipating element and an air gap above said heat dissipating element; and a heat generating component mounted on said mounting plate at a second major surface opposite said first major surface.

* * * * *